United States Patent
Guclu et al.

(10) Patent No.: US 6,965,235 B1
(45) Date of Patent: Nov. 15, 2005

(54) APPARATUS TO SIMULATE MR PROPERTIES OF HUMAN BRAIN FOR MR APPLICATIONS EVALUATION

(75) Inventors: Ceylan C. Guclu, Waukesha, WI (US); Timothy W. Skloss, Waukesha, WI (US); Robert M. Vavrek, Waukesha, WI (US); Ricardo Becerra, Waukesha, WI (US)

(73) Assignee: General Electric Company, Milwaukee, WI (US)

( * ) Notice: Subject to any disclaimer, the term of this patent is extended or adjusted under 35 U.S.C. 154(b) by 45 days.

(21) Appl. No.: 10/604,481

(22) Filed: Jul. 24, 2003

(51) Int. Cl.⁷ .............................................. G01V 3/00
(52) U.S. Cl. ..................................................... 324/318
(58) Field of Search ............................... 324/300, 307, 324/309, 314, 318

(56) References Cited

U.S. PATENT DOCUMENTS

| | | | |
|---|---|---|---|
| 4,551,678 A | 11/1985 | Morgan et al. | 324/300 |
| 4,613,819 A | 9/1986 | Chui | 324/308 |
| 4,644,276 A | 2/1987 | Sierocuk et al. | 324/307 |
| 4,719,406 A | 1/1988 | Schaefer et al. | 324/318 |
| 4,729,892 A | 3/1988 | Beall | 424/9 |
| 4,774,957 A | 10/1988 | Nambu et al. | 128/653 |
| 4,777,442 A * | 10/1988 | Rosenthal | 324/318 |
| 4,888,555 A * | 12/1989 | Vaughan et al. | 324/318 |
| 4,933,584 A | 6/1990 | Harms et al. | 310/162 |
| 5,312,755 A | 5/1994 | Madsen et al. | 436/8 |
| 5,322,682 A * | 6/1994 | Bartzokis et al. | 600/410 |
| 5,351,006 A | 9/1994 | Sumanaweera et al. | 324/309 |
| 5,532,006 A | 7/1996 | Lauterbur et al. | 424/9.322 |
| 2003/0218459 A1 * | 11/2003 | Reddy et al. | 324/314 |

* cited by examiner

*Primary Examiner*—Louis Arana
*Assistant Examiner*—Dixomara Vargas
(74) *Attorney, Agent, or Firm*—Ziolkowski Patent Solutions Group, SC; Michael A. Della Penna; Carl B. Horton

(57) ABSTRACT

A system and method for mimicking a human brain for MR imaging at various magnetic field strengths is disclosed. A phantom is constructed of a structure having a number of sections. A first section contains a mixture of nickel chloride, agarose gel powder, potassium sorbate, deuterium oxide, and water such that the T1, T2, and proton density values of the first section mimic white matter of the human brain. A second section contains different amounts of the same components such that the T1, T2, and proton density values of the second section mimic gray matter of the human brain. As such, when the phantom is scanned in an MR imaging machine, an optimized flip angle for T1-weighted imaging to improve contrast between white matter and gray matter of the human brain that takes into account proton density differences therebetween can be determined.

27 Claims, 4 Drawing Sheets

APPARATUS TO SIMULATE MR PROPERTIES OF HUMAN BRAIN FOR MR APPLICATIONS EVALUATION

BACKGROUND OF INVENTION

The present invention relates generally to simulating anatomical conditions of a patient for MR applications evaluation and, more particularly, to an apparatus and method for simulating brain properties for improved MR scanner calibration and pulse sequence design.

To properly develop and test imaging protocols and techniques it is necessary for radiologists, researchers, software design engineers, and technicians to accurately and precisely simulate imaging conditions including general anatomical conditions of a typical patient. Known techniques include the use of animals to simulate the anatomical conditions of a human patient. Using animals to create a sample test condition has a number of disadvantages.

First, acquisition and care of animals often requires extensive and continual expenditures. Animals must be properly cared for and fed to maintain the health of the animal but also to be compliant with a number of regulations associated with animal testing. Further, in the absence of a well-trained animal, it is often necessary to sedate the animal, otherwise the animal may be uncooperative in simulating the test conditions. Moreover, the social climate associated with using animals and testing laboratories may be such that a company or research group may be publicly adversely affected by the use of animals in medical testing.

Additionally, researchers and design engineers forfeit a certain amount of control over the testing conditions by using animals to simulate human anatomical conditions. For example, without using expensive and potentially detrimental drugs to simulate precise human anatomical patterns, researchers and software designers are unable to exactly define and control the anatomical conditions, such as, defining brain activity. That is, researchers cannot reasonably force data to precisely mimic data taken from a human brain scan. Further, it is considerably more difficult for researchers and software engineers to repeat particular conditions using live animals.

While animals may be a viable alternative for mimicking certain human physiology and physiologic activity, the human brain is not reproduced in these species. As such, testing must be done on human test subjects. The requirement for human volunteers is often difficult to arrange, requires extensive regulatory approval, and presents a large measurement variation.

The use of phantoms presents a second alternative to human testing. Scanning of a phantom alleviates most of the considerations associated with animal or human test subject scanning. Known phantoms however do not accurately mimic the human brain. Such existing phantoms do not exactly differentiate the proton densities between white matter and gray matter of the human brain. Consequently, an optimum flip angle, which is proton density sensitive, for such phantoms, is typically set to 90 degrees for a T1-weighted spin-echo imaging. It has been shown that the optimum flip angle for human scanning is not always 90 degrees to maximize the tissue contrast. An accurate flip angle provides image contrast between white matter and gray matter of human brain scans that take into account proton density differences. As such, pulse sequence generation and machine calibration for human brain scanning is not optimized since current brain phantoms do not differentiate between white matter and gray matter proton densities.

Additionally, the optimal flip angle for contrast may very depending upon the specifics of the pulse sequence. That is, the optimal flip angle may be more or less than 90 degrees depending upon the particular MR study.

Therefore, it would be desirable to design an apparatus and method for simulating a human brain that allows for optimization of the pulse sequence parameters GMSGEMS Let"s make this more general. The invention is not only for T1-weighted imaging sequences. or scan protocols.

SUMMARY OF INVENTION

The present invention provides an apparatus and method for simulating a human brain MR image which overcomes the aforementioned drawbacks. A phantom is constructed of a gridded structure that supports a plurality of tubes. A first group of tubes contain a mixture of nickel chloride, agarose gel powder, potassium sorbate, deuterium oxide, and water such that the T1, T2, and proton density values of the first group of tubes mimic white matter of the human brain. A second group of tubes contain different amounts of these components such that the magnetic-field-dependent T1, T2, and proton density values of the second group of tubes mimic gray matter of the human brain. The phantom takes into account the difference in proton density between white matter and gray matter of the human brain. As such, when the phantom is scanned in an MR imaging scanner with a T1-weighted imaging sequence, an optimized flip angle can be determined in order to maximize contrast between white matter and gray matter of the human brain.

The present invention allows for experimental determination of an optimal flip angle for any protocol in which proton density plays a significant part. The present invention may also be used for the verification of protocols designed to exploit differences in proton density of a target tissue(s), or as part of a daily quality assurance program at a customer site. The phantom may also be used to assess system performance.

In accordance with one aspect of the invention, a brain tissue phantom for MR applications evaluation is disclosed having a structure constructed to support a plurality of sections. A first section contains material to emulate white matter of a human brain and a second section contains material to emulate gray matter of the human brain. Each section further contains deuterium oxide to accommodate proton density differences in white matter and gray matter of the human brain. This phantom therefore allows the configuration of a pulse sequence that improves contrast between white matter and gray matter of a human brain and takes into account proton densities therebetween.

In accordance with another aspect of the invention, a method of manufacturing a human brain phantom for MR applications includes constructing a base having a plurality of cavities. A first set of cavities have paramagnetic salt powder, agarose powder, deuterium oxide, and water therein. A second set of cavities have paramagnetic salt powder, agarose powder, deuterium oxide, and water therein. Such a construction improves white matter to gray matter contrast, yet, replicates proton density differences between the types of matter.

According to another aspect of the invention, a method of evaluating MR applications is disclosed that includes the steps of placing a phantom which mimics a first tissue and a second tissue in a magnetic field, applying a T1-weighted sequence to acquire T1-weighted MR data of the phantom, and determining, from a reconstructed image of the MR data, an optimum flip angle for the T1-weighted sequence when used to acquire data of a tissues having characteristics similar to that of the phantom.

In accordance with yet another aspect of the invention, a human brain phantom kit is disclosed that includes a plurality of receptacles, a racking system having a plurality of cells, each of which is constructed to receive a receptacle, a first mixture comprising paramagnetic material, agarose material, and deuterium oxide, and a second mixture comprising paramagnetic material, agarose material, and deuterium oxide. The amount of deuterium oxide in the first mixture is sufficient to mimic proton density characteristics of human brain white matter and the amount of deuterium oxide in the second mixture is sufficient to mimic proton density characteristics of human brain gray matter. The paramagnetic material and the agarose material mimic T1 and T2 of human brain characteristics, respectively.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
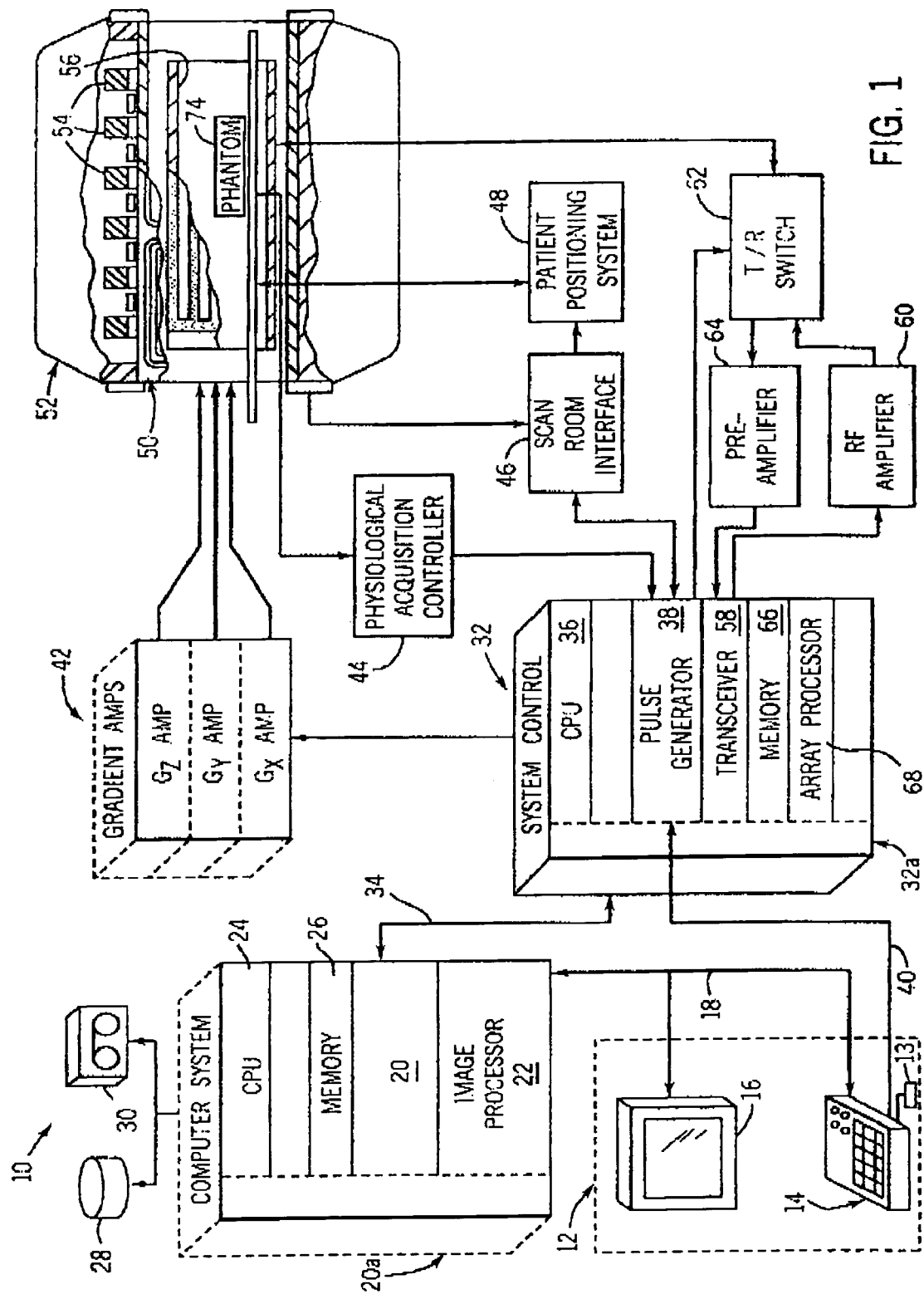
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
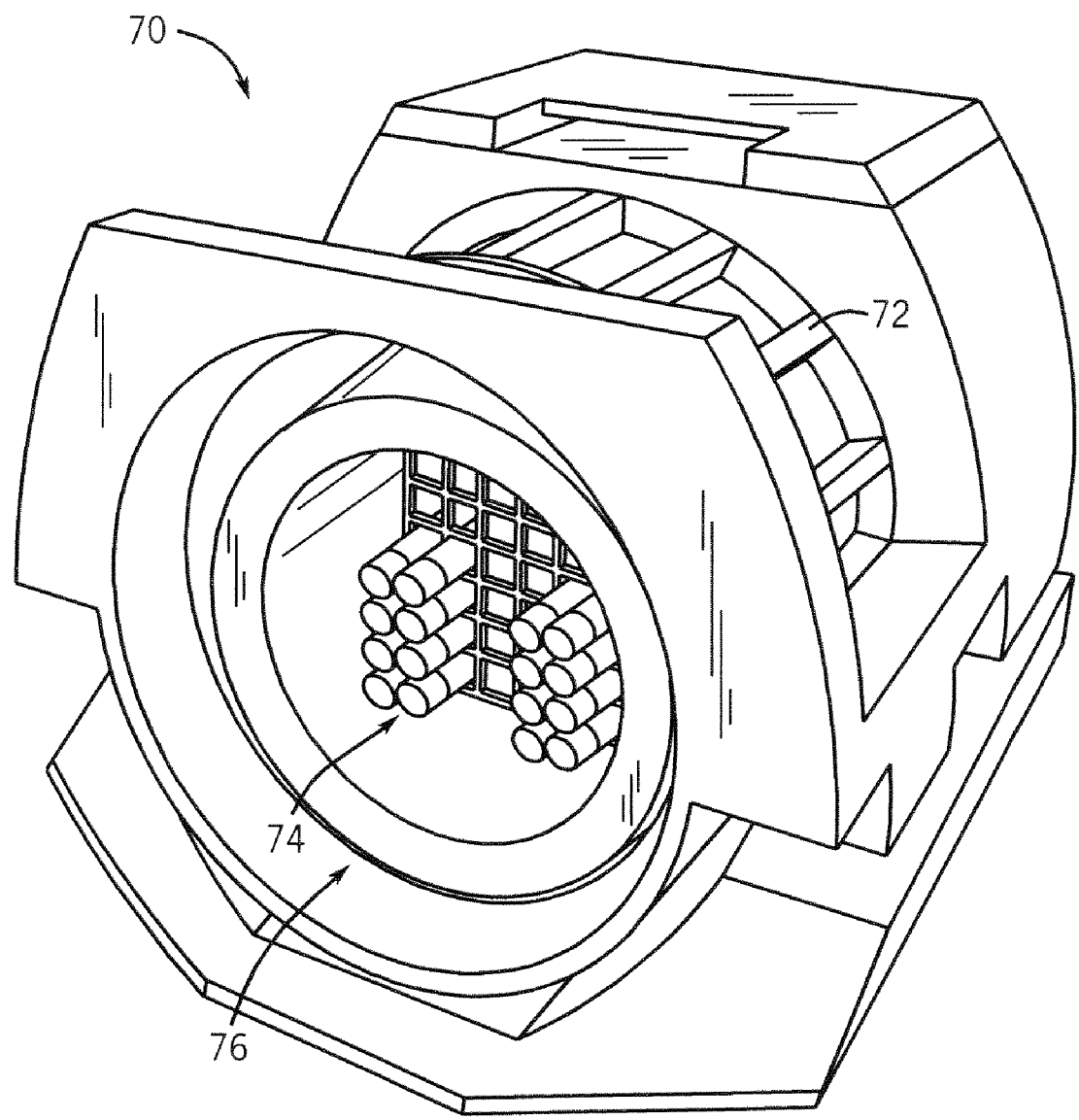
FIG. 2 is a coil phantom loader for use with the MR imaging system of FIG. 1.

An RF head coil assembly with a coil loader 70 for use with the MRI system 10 is shown in FIG. 2. The RF head coil assembly 70 has an RF coil assembly 72 disposed about a phantom 74. Phantom 74 is positioned in a generally central volume 76 of RF head coil assembly 70. Once phantom 74 is loaded into the RF head coil assembly 70, the RF head coil assembly 70 is positioned within a bore of the MRI system 10 of FIG. 1. An imaging sequence, preferably T1-weighted, is applied to the phantom such that data is acquired from the phantom and an image is generated therefrom. This image provides a technician with the ability to determine if greater contrast can be achieved between the white matter and gray matter mimics of the phantom. If greater contrast is desired, the flip angle is adjusted and the phantom is rescanned. When adequate contrast is established between the white matter and gray matter of the image, the flip angle for the T1-weighted image sequence is considered optimized.

Figure 3:
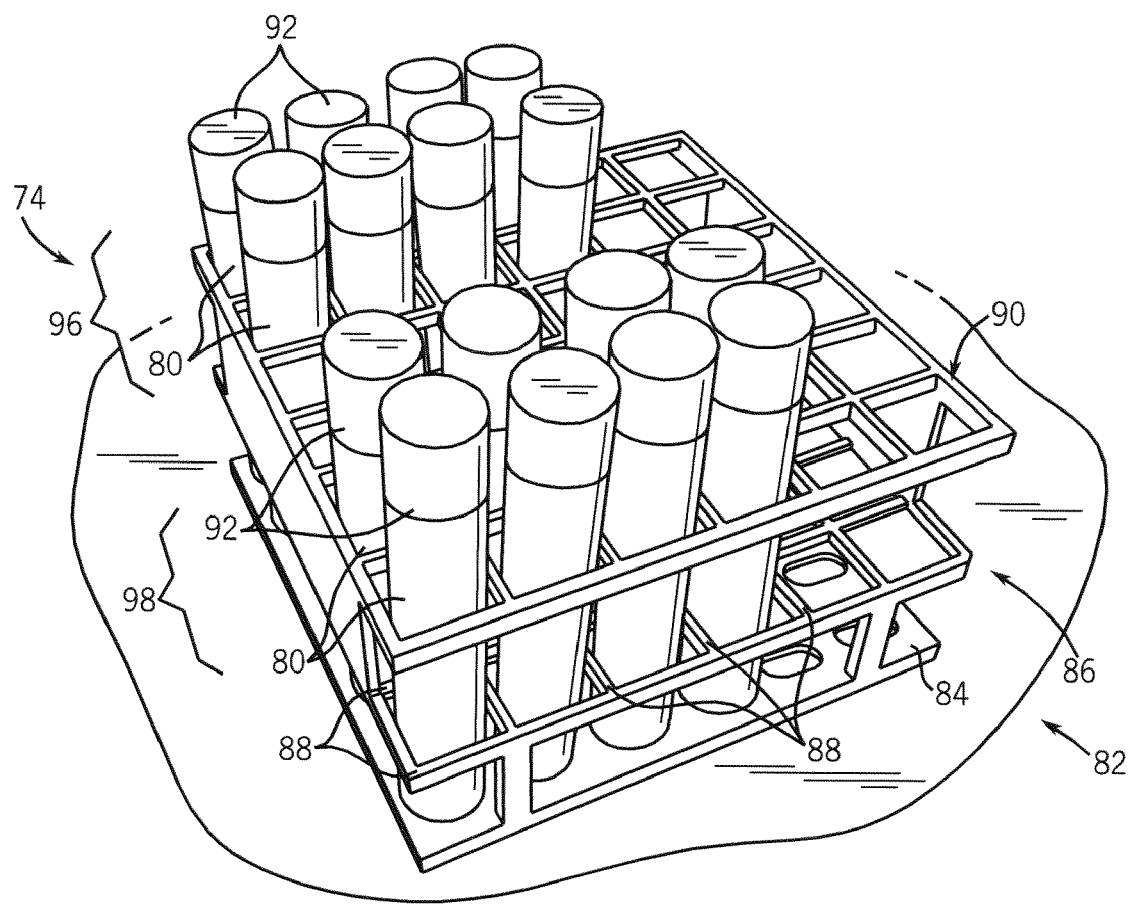
FIG. 3 is a human brain phantom in accordance with one embodiment of the present invention.

FIG. 3 shows phantom 74 in an upright position. A plurality of tubes 80 are positioned in a holder 82. Holder 82 has a base 84 and a frame 86. Frame 86 is attached to base 84 and has a plurality of rails 88 that collectively for a gridded structure. The space between adjacent rails 88 define a plurality of cavities 90 constructed to accommodate individual tubes 80 therein. It is understood that frame 86 could be either an assembly of individual rails and a base or of a unitary molded construction. A removable cap 92 is positioned at an open end of each tube. The tubes 80 are separated into a white matter section, or set 96 and a gray matter section, or set 98. Collectively, the sets of tubes, or sections, emulate characteristics of an average adult human brain absent of abnormalities or pathologies. As such, each tube contains a mixture of material that simulates T1 and T2 relaxation times, and proton densities of those found in the human brain at various field strengths.

The following is provided for an example only and is not intended to limit the invention in any manner. The tubes include materials to mimic cerebral spinal fluid (CSF).

The values of T1 and T2 relaxation times, and hydrogen proton density for human brain white matter and gray matter vary across an imaging population. However, average values for white matter have been empirically determined to have a T1 of 600 milliseconds (hereinafter ms) and a T2 of a 90 ms at 1.5 T. Average human brain gray matter has been determined to have a T1 of 1000 ms and a T2 of 100 ms. It is understood that these values are specific to a demographic of patients. The amount of nickel chloride is used to set the T1 relaxation time of the hydrogen protons and the amount of agarose gel powder determines the T2 relaxation time of hydrogen protons. It is understood that other paramagnetic salts and agarose gels may be substituted for those specifically referenced herein. Potassium sorbate operates as a preservative to sustain the life span of the gels and as such, has equal concentrations in both the white matter and the gray matter. Deuterium oxide, water with two deuterium atoms instead of hydrogen, displaces the hydrogen proton density and is included such that the proton density of the white matter phantom 96 and the proton density of the gray matter phantom 98 mimic the proton density of white of the white matter set 96 contain, in one example, 1.532 millimolar nickel chloride ($NiCl_2$), 1.09% by weight agarose gel powder, 0.1% by weight potassium sorbate, 35% by volume deuterium oxide ($D_2O$), and 65% by volume water. In contrast, the tubes of gray matter set 98 contain, in one example, 0.904 millimolar nickel chloride ($NiCl_2$), 0.95% by weight agarose gel powder, 0.1% by weight potassium sorbate, and 20% by volume deuterium oxide ($D_2O$), and 80% by volume water. The exact values for the white and gray matter compositions depend on the human brain characteristics sought to be mimicked. However, generally, 0 to 25 millimolar of nickel chloride, an agarose powder concentration of 0–2.5 w/w %, a potassium sorbate concentration of 0–0.5 w/w % and a deuterium oxide level from 0 to 100 v/v % illustrate a range of values or quantities. One skilled in the art will recognize that additional and alternative stoichiometric combinations are possible and contemplated to simulate other brain populations. Additionally, it is understood that gadolinium dichloride, copper sulfate, manganese dichloride, and other paramagnetic salts are suitable substitutes for nickel chloride, albeit in different respective concentrations. Furthermore, the phantom may be constructed to matter and gray matter of the human brain, respectively. The respective amounts of deuterium oxide approximate the proton density of the white matter and gray matter of the phantom, such that an appropriate flip angle can be determined. Optimum flip angle is dependant upon proton density as well as T1 and T2 of the target time. Therefore, the more accurate the proton density of the phantom, the more the flip angle for a T1-weighted sequence may be optimized for scanning of a patient, and therefore, the contrast of a reconstructed image is improved.

As such, the set of white matter tubes and the set of gray matter tubes which include 35% by volume and 20% by volume deuterium oxide, respectively, mimic the proton densities of the human brain. As such, adjusting the flip angle and rescanning the phantom can be repeated until a desired image contrast between white matter and gray matter of the phantom is achieved. Additionally, the use of deuterium oxide to manipulate the magnetic properties of the phantom presents no detrimental effects on the quality of a scanned image. As such, a T1-weighted image is acquired of phantom 74 such that an optimum flip angle can be determined and used to acquire a maximized T1 contrasted image during clinical examination of a patient.

White matter set 96 and gray matter set 98 are manufactured from a plurality of components. The specifics of which have been discussed above. It is envisioned that the dry elements of the mixture can be placed in one of the respective tubes 80 and then the liquid component(s) added thereto. In this manner, the agarose, being a dry element, when mixed with hot water, dissolves and, when cooled, solidifies the mixture in the form of a gel. In this manner, the specific constituents of the mixture are substantially suspended uniformly throughout the gel to mimic the proton densities, and to set T1 and T2. In one embodiment, each of the tubes which receive the components of the white matter material and each of the tubes which receive the components of the gray matter material are substantially similar, respectively.

The human brain phantom has been heretofore described as being comprised of a number of tubes arranged into two separate and distinct sections wherein each section contains a combination of chemicals to mimic MR properties, such as proton density and T1 and T2 relaxation times, of a human brain. However, one skilled in the art would readily recognize that the tubes illustrate one example of a receptacle in which the compositions may be disposed. For example, the receptacles may have a different cross-sectional shape than the circular cross-sectional shape illustrated in the tubes shown in FIG. 3. That is, the receptacles may have a rectangular or square shaped cross-section.

Additionally, the phantom of FIG. 3 has been described such that each of the receptacles of each section has a common composition. That is, in one embodiment, each tube or receptacle of the white matter section has the same composition of materials and each tube or receptacle of the gray matter section has the same composition of materials, but a composition different from the white matter receptacles. However, one skilled in the art will appreciate that the receptacles within each section may have varying or different compositions. In this regard, one tube may be filled with a first solution and an adjacent tube of the same section may be filled with a second solution.

Furthermore, it is contemplated that more than one receptacle or tube occupy a single cavity or cell in the phantom holder. That is, the length of two tubes or receptacles could be reduced by one-half. Each tube may then be filled with a solution such that one tube has a first solution and the second tube has another solution different from the first. Both tubes are then placed abutted to one another in a single cavity. In this regard, partial volume studies of a particular slice may be carried out. Moreover, the receptacles may be constructed of a pliable material of arbitrary shapes and sizes. In this regard, the receptacles are spatially organized at varying or irregular intervals. For example, balloons may be filled with different amounts of solution and secured within a rigid container. The balloons would be arbitrarily oriented within the container. Additionally, other methods of dispersing various amounts of solution within a three-dimensional space or volume are possible and are within the scope of the invention.

Additionally, as noted above, the solutions deposited in each receptacle may also include materials to mimic CSF in a human brain. In one embodiment, the material or mixture to mimic CSF contains 0.08 millimolar $CuSO_4$ in deionized water. To further mimic CSF activity, the phantom may be constructed to respond to a pump or other device to cause a pulsation of the CSF. Preferably, the pump or other device is controlled remotely.

Figure 4:
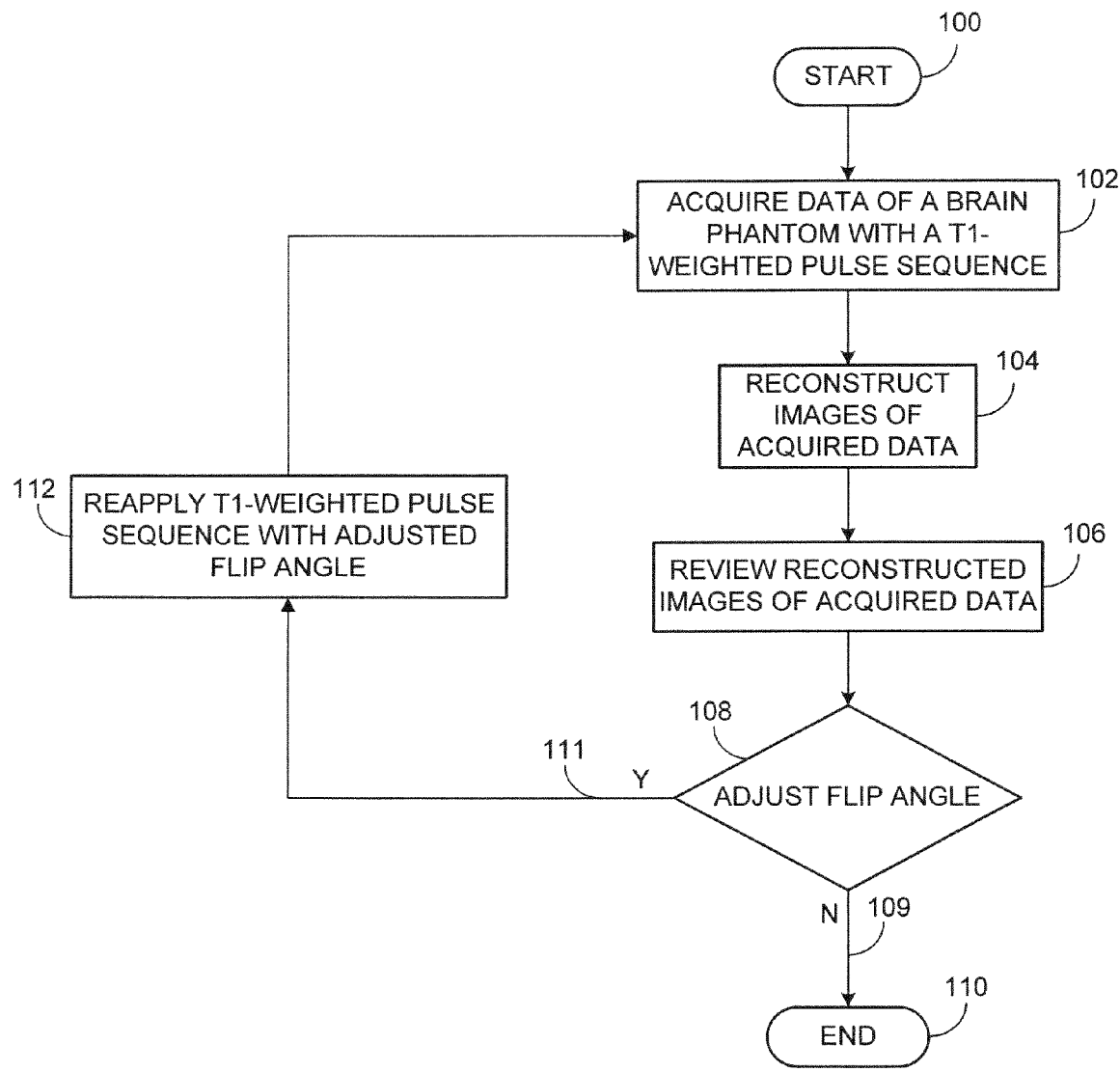
FIG. 4 is a flow chart setting forth the steps of an imaging and calibration technique for optimizing flip angle of a T1-weighted imaging sequence.

FIG. 4 illustrates a process of optimizing flip angle of a T1-weighted image for human brain imaging. At the start of the process 100, data is acquired 102 from the phantom with a T1-weighted pulse sequence. Once the phantom has been scanned, an image is reconstructed 104 from the acquired data. This image is reviewed for contrast 106 between the white and the gray matter of the brain phantom. If the contrast is sufficient, there is no need to adjust the flip angle 109 of the T1-weighted sequence and the process ends 110. If the contrast between the white and gray matter in the reconstructed image needs to be improved 111, the flip angle is adjusted and another T1-weighted sequence is applied with the adjusted flip angle 112. The process of scanning the phantom is repeated until an acceptable level of contrast taking into account proton density is shown in the reconstructed image between the white matter and the gray matter of the phantom.

In accordance with one embodiment of the invention, a brain tissue phantom for MR applications evaluation is disclosed having a structure constructed to support a plurality of sections. The phantom has a first section that contains material to emulate white matter of a human brain and a second section that contains material to emulate gray matter of the human brain. Each section further contains deuterium oxide to accommodate proton density differences in white matter and gray matter of the human brain. As such, a pulse sequence can be configured to obtain improved contrast between white matter and gray matter of the human brain and takes into account the proton densities therebetween.

In accordance with another embodiment of the invention, a method of manufacturing a human brain phantom for MR applications includes constructing a base having a number of interstitial cavities. A first combination of paramagnetic powder, agarose powder, deuterium oxide, and water is deposited in a first set of cavities and a second combination of paramagnetic powder, agarose powder, deuterium oxide, and water is deposited in a second set of cavities. Such a construction improves white matter to gray matter contrast, yet, replicates proton density differences between the types of matter.

According to a further embodiment of the invention, a method of evaluating MR applications is disclosed that includes the steps of placing a phantom in a relatively homogeneous magnetic field BO, wherein the phantom has at least a material to mimic proton density differences of a first tissue and a second tissue, applying a T1-weighted sequence to acquire T1-weighted MR data of the phantom, and determining, from an image reconstructed from the MR data, an optimum flip angle for the T1-weighted sequence then used to acquire data of tissues having characteristics similar to that of the phantom.

In accordance with yet another embodiment of the invention, a kit is disclosed that may be provided to medical personnel to form a human brain phantom for MR imaging applications. The kit includes a plurality of receptacles, a system having a plurality of cells, each of which is constructed to receive a receptacle, a first mixture comprising paramagnetic material, agarose material, and deuterium oxide, and a second mixture comprising paramagnetic material, agarose material, and deuterium oxide wherein the first mixture has a proton density similar to human brain white matter and the second mixture has a proton density similar to human brain gray matter such that the phantom produced thereby mimics the white matter and gray matter proton density characteristics of a human brain.

The present invention has been described in terms of the preferred embodiment, and it is recognized that equivalents, alternatives, and modifications, aside from those expressly stated, are possible and within the scope of the appending claims.

What is claimed is:

1. A phantom for MR applications evaluation comprising:
    a structure constructed to support a plurality of sections, wherein the structure includes a grid defining a plurality of multi-layer cells, and wherein each section is supported by at least two cell layers;
    a first section containing material to emulate the MR properties of white matter of a human brain;
    a second section containing material to emulate the MR properties of gray matter of a human brain; and
    wherein the MR properties of the first and second sections differ in proton density.

2. The phantom of claim 1 wherein each section contains paramagnetic salt and agarose gel for T1 and T2 control.

3. The phantom of claim 2 wherein the first section further comprises a plurality of tubes wherein each tube contains a common composition of paramagnetic gel, agarose gel, deuterium oxide, and water.

4. The phantom of claim 3 wherein the common composition includes approximately:
    1.5 millimolar nickel(II) chloride paramagnetic salt;
    1 percent by weight agarose gel;
    35 percent by volume deuterium oxide;
    65 percent by volume water; and
    0.1% potassium sorbate.

5. The phantom of claim 2 wherein the second section further comprises a plurality of tubes wherein each tube contains a common composition of paramagnetic salt, agarose gel, deuterium oxide, and water.

6. The phantom of claim 5 wherein the common composition includes approximately:
    0.9 millimolar nickel(II) chloride paramagnetic salt;
    1 percent by weight agarose gel;
    20 percent by volume deuterium oxide;
    80 percent by volume water; and
    0.1% potassium sorbate.

7. The phantom of claim 1 wherein the first and second sections contain deuterium oxide and wherein the amount of deuterium oxide in each section is set to a level to optimize flip angle in T1-weighted sequences for human scanning.

8. A method of manufacturing a phantom for MR evaluation comprising the steps of:
   constructing a base having a number of interstitial cavities;
   depositing a first combination of paramagnetic powder, agarose powder, deuterium oxide, and water in a first set of interstitial cavities; and
   depositing a second combination of paramagnetic powder, agarose powder, deuterium oxide, and water in a second set of interstitial cavities.

9. The method of claim 8 further comprising providing a plurality of tubes to receive the first and second combinations therein, respectively, and to be located in the interstitial cavities.

10. The method of claim 9 further comprising the step of depositing the first combination and the second combination such that the paramagnetic powder and the agarose powder mix with the water to form a paramagnetic gel and an agarose gel in each tube, respectively.

11. The method of claim 9 wherein the first combination includes approximately 65 percent by volume water, and approximately 35 percent by volume deuterium oxide and the second combination includes approximately 80 percent by volume water, and approximately 20 percent by volume deuterium oxide.

12. The method of claim 9 further comprising the step of removably sealing an open end of each tube.

13. The method of claim 9 further comprising the step of placing the tubes in the interstitial cavities such that each tube of the first set of tubes is at least adjacent to at least one other tube of the first set and that each tube of the second set of tubes is at least adjacent to at least one other tube of the second set.

14. The method of claim 13 wherein the first set of tubes emulates MR characteristics of white brain matter of a human brain and the second set of tubes emulates MR characteristics of gray matter of a human brain.

15. The method of claim 8 further comprising providing a plurality of rails to form the interstitial cavities.

16. A method of evaluating MR applications comprising the steps of:
   (A) placing a phantom in a relatively homogeneous magnetic field, BO, wherein the phantom includes at least material to mimic proton density differences between a first tissue and a second tissue;
   (B) applying a T1-weighted sequence to acquire T1-weighted MR data of the phantom; and
   (C) determining an optimum flip angle for T1-weighted imaging of a human brain having characteristics similar to that of the phantom when subjected to BO.

17. The method of claim 16 further comprising the step of repeating steps (B) through (C), and applying another T1-weighted sequence different to that applied at step (B).

18. The method of claim 16 wherein an optimum flip angle is determined to be less than 90 degrees.

19. The method of claim 16 wherein the material includes deuterium oxide.

20. The method of claim 19 wherein the phantom further includes paramagnetic gel, agarose gel, and water.

21. The method of claim 20 wherein the first tissue corresponds to white matter in a human brain and includes 65 percent by volume water, 1.532 millimoles of $NiCl_2$, 1.09 percent by weight agarose gel, and 35 percent by volume deuterium oxide, and the second tissue corresponds to gray matter in a human brain and includes 80 percent by volume water, 0.904 millimoles of $NiCl_2$, 0.95 percent by weight agarose gel, and 20 percent by volume deuterium oxide.

22. The method of claim 16 further comprising the step of reconstructing at least one image of the phantom, reviewing the at least one image for contrast, adjusting flip angle of the T1-weighted sequence, and reacquiring data for reconstruction of another at least one image.

23. A kit to form a human brain phantom for MR imaging applications comprising:
   a plurality of receptacles;
   a system having a plurality of cells wherein each cell is constructed to receive a receptacle;
   a first mixture comprising paramagnetic material, agarose material, and deuterium oxide; and
   a second mixture comprising paramagnetic material, agarose material, and deuterium oxide; and
   wherein the first mixture has a proton density substantially equivalent to human brain white matter, and the second mixture has a proton density substantially equivalent to human brain gray matter.

24. The kit of claim 23 wherein each receptacle further comprises a resealable tube.

25. The kit of claim 23 further comprising a third mixture that includes material to mimic cerebral spinal fluid (CSF) in a human brain.

26. A phantom for MR applications evaluation comprising:
   a structure constructed to support a plurality of sections;
   a first section containing material to emulate the MR properties of white matter of a human brain;
   a second section containing material to emulate the MR properties of gray matter of a human brain;
   wherein the MR properties of the first and second sections differ in proton density;
   wherein each section contains paramagnetic salt and agarose gel for T1 and T2 control;
   wherein the first section further comprises a plurality of tubes wherein each tube contains a common composition of paramagnetic gel, agarose gel, deuterium oxide, and water; and
   wherein the common composition includes approximately:
   1.5 millimolar nickel(II) chloride paramagnetic salt;
   1 percent by weight agarose gel;
   35 percent by volume deuterium oxide;
   65 percent by volume water; and
   0.1% potassium sorbate.

27. A phantom for MR applications evalution comprising:
   a structure constructed to support a plurality of sections;
   a first section containing material to emulate the MR properties of white matter of a human brain;
   a second section containing material to emulate the MR properties of gray matter of a human brain;
   wherein the MR properties of the first and second sections differ in proton density;
   wherein each section contains paramagnetic salt and agarose gel for T1 and T2 control;
   wherein the second section further comprises a plurality of tubes wherein each tube contains a common composition of paramagnetic salt, agarose gel, deuterium oxide, and water; and
   wherein the common composition includes approximately:
   0.9 millimolar nickel(II) chloride paramagnetic salt;
   1 percent by weight agarose gel;
   20 percent by volume deuterium oxide;
   80 percent by volume water; and
   0.1% potassium sorbate.

* * * * *

UNITED STATES PATENT AND TRADEMARK OFFICE
CERTIFICATE OF CORRECTION

PATENT NO. : 6,965,235 B1 Page 1 of 1
DATED : November 15, 2005
INVENTOR(S) : Guclu et al.

It is certified that error appears in the above-identified patent and that said Letters Patent is hereby corrected as shown below:

Column 9,
Lines 42 and 49, delete "BO" and substitute -- B0 --.

Signed and Sealed this

Seventh Day of February, 2006

JON W. DUDAS
*Director of the United States Patent and Trademark Office*